(12) United States Patent
Park et al.

(10) Patent No.: US 10,048,118 B2
(45) Date of Patent: Aug. 14, 2018

(54) SENSOR PACKAGE HAVING A TRANSPARENT COVERING MEMBER SUPPORTED BY ELECTRONIC COMPONENT AND METHOD OF MANUFACTURING THE SAME

(71) Applicant: SAMSUNG ELECTRO-MECHANICS CO., LTD., Suwon-si (KR)

(72) Inventors: Seung Wook Park, Suwon-si (KR); No Il Park, Suwon-si (KR); Tae Sung Jeong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 190 days.

(21) Appl. No.: 15/095,490

(22) Filed: Apr. 11, 2016

(65) Prior Publication Data

US 2017/0059395 A1    Mar. 2, 2017

(30) Foreign Application Priority Data

Aug. 31, 2015 (KR) .................. 10-2015-0122701

(51) Int. Cl.
*H01L 27/146* (2006.01)
*G01J 1/04* (2006.01)

(52) U.S. Cl.
CPC ........ *G01J 1/0407* (2013.01); *H01L 27/1469* (2013.01); *H01L 27/14618* (2013.01); *H01L 27/14634* (2013.01); *H01L 2224/48091* (2013.01); *H01L 2224/8592* (2013.01); *H01L 2924/16195* (2013.01)

(58) Field of Classification Search
CPC .......... H01L 27/14634; H01L 27/1469; H04N 5/2254; H04N 5/2257; G01J 1/0407
USPC ................. 250/551, 239, 216, 208.1
See application file for complete search history.

(56) References Cited

U.S. PATENT DOCUMENTS

| 6,590,269 | B1 | 7/2003 | Chuang et al. |
| 7,714,931 | B2 * | 5/2010 | Singh ............... H01L 27/14618 |
| | | | 348/374 |
| 8,390,087 | B2 | 3/2013 | Tu et al. |
| 8,969,120 | B2 | 3/2015 | Huang et al. |
| 9,060,111 | B2 * | 6/2015 | Shukla ............... H04N 5/2257 |
| 2009/0045476 | A1 | 2/2009 | Peng et al. |

FOREIGN PATENT DOCUMENTS

| KR | 10-2009-0017961 A | 2/2009 |
| KR | 10-2010-0041383 A | 4/2010 |

* cited by examiner

*Primary Examiner* — Que T Le
(74) *Attorney, Agent, or Firm* — NSIP Law

(57) ABSTRACT

A sensor package and a method of manufacturing the same are provided. A sensor package includes a substrate on which an image sensor is mounted, an electronic component mounted on the substrate, and a transparent member coupled to the electronic component and covering the image sensor.

19 Claims, 5 Drawing Sheets

SENSOR PACKAGE HAVING A TRANSPARENT COVERING MEMBER SUPPORTED BY ELECTRONIC COMPONENT AND METHOD OF MANUFACTURING THE SAME

CROSS-REFERENCE TO RELATED APPLICATION

This application claims the benefit under 35 USC 119(a) of Korean Patent Application No. 10-2015-0122701 filed on Aug. 31, 2015, in the Korean Intellectual Property Office, the entire disclosure of which is incorporated herein by reference for all purposes.

BACKGROUND

1. Field

The following description relates to a sensor package and a manufacturing method of the same, and to a transparent member for protecting an image sensor.

2. Description of Related Art

Apparatuses including camera modules have recently increased. Camera modules are commonly mounted in many portable terminals such as portable phones, smartphones, tablet PCs, and the like.

When a camera module is applied to a vehicle, a camera may be provided in a device such as a rear-viewing camera module and be mounted to the vehicle.

Such a camera module includes an image sensor. To maintain the functionality of such an image sensor, a transparent member protecting the image sensor is commonly provided.

Providing such a transparent member has conventionally required installing a separate housing to cover the image sensor. Thus, additional processes for manufacturing the housing and coupling the housing with the transparent member have resulted in an increase in manufacturing costs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a sensor package includes a substrate on which an image sensor is mounted, an electronic component mounted on the substrate, and a transparent member coupled to the electronic component and covering the image sensor.

A height of the electronic component may be greater than a height of the image sensor.

The image sensor may be attached to the substrate via wire bonding.

A height of the electronic component may be greater than a height of an apex of a wire.

The electronic component may be located at the periphery of the image sensor.

The electronic components may be provided on both sides of the image sensor.

The general aspect of the sensor package may further include an adhesive member coupling the transparent member to the electronic component.

The adhesive member may be provided in a plurality of electronic components having different heights and couples the transparent member to the electronic components parallel to the substrate.

The adhesive member may include a first adhesive member provided in a first electronic component located on one side of the image sensor, and a second adhesive member provided in a second electronic component having a lesser height than that of the first electronic component and located on another side of the image sensor, and a thickness of the second adhesive member may be greater than a thickness of the first adhesive member by an amount equal to a height difference between the first electronic component and the second electronic component.

The electronic component may be one of a resistor, a condenser, and an inductor.

In another general aspect, a method of manufacturing a sensor package may involve coupling a transparent member to an electronic component provided on a substrate to cover an image sensor provided on the substrate.

The coupling of the transparent member may involve obtaining the substrate on which the image sensor and the electronic components are mounted, applying an adhesive member to a surface of the electronic component opposite from the substrate, and positioning the transparent member on the adhesive member applied on the electronic component.

The applying of the adhesive member may involve applying the adhesive member to the electronic component in a liquid or semi-solid state.

The applying of the adhesive member may involve applying the adhesive member to the electronic component as a solid film.

During the coupling of the transparent member, a plurality of electronic components may be provided around the substrate such that the plurality of electronic components may support the transparent member above the image sensor.

In yet another general aspect, a sensor package includes an image sensor and an electronic component disposed on a substrate; and a transparent member disposed on the electronic component and covering the image sensor.

The general aspect of the sensor package may further include an adhesive member disposed between the transparent member and the image sensor.

A plurality of electronic components may be disposed on the substrate at two opposing sides of the image sensor such that the electronic components support the transparent member above the image sensor disposed therebetween.

The sensor package may be configured as a camera module for a vehicle.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
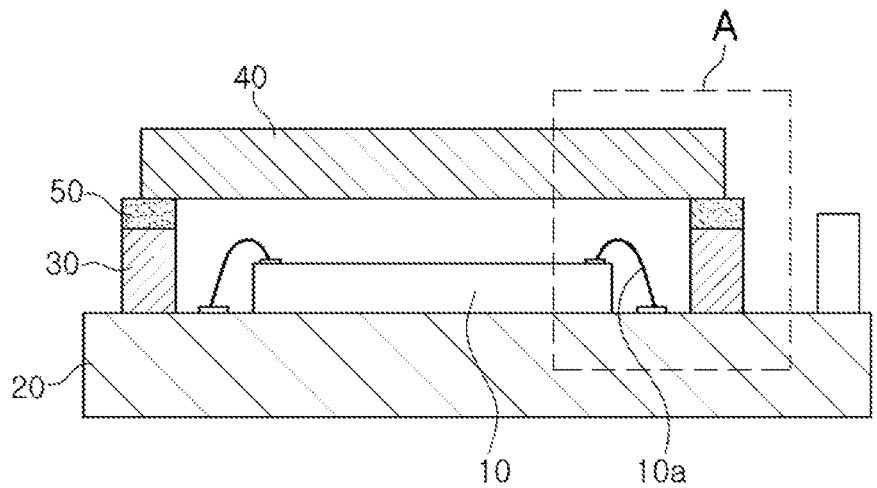
FIG. 1 is a cross-sectional view illustrating an example of a sensor package.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing various embodiments only and is not intended to limit the present description. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present description will be described with reference to schematic views. In the drawings, for example, due to manufacturing techniques and/or tolerances, modifications of the shape shown may be estimated. Thus, embodiments should not be construed as being limited to the particular shapes of regions shown herein, for example, to include a change in shape results in manufacturing. The following embodiments may also be constituted by one or a combination thereof.

As noted above, when a transparent member is mounted over a camera in a camera module, a separate housing is provided to house the camera. The use of the separate housing results in high manufacturing cost. Moreover, with the addition of such a housing, it is difficult to miniaturize a camera module. Therefore, research into a sensor package and a manufacturing method of the same are necessary to overcome limitations imposed by the use of the separate housing.

An aspect of the present disclosure may provide a sensor package that allows a product to be smaller and which allows a simplification of the manufacturing process.

Figure 2:
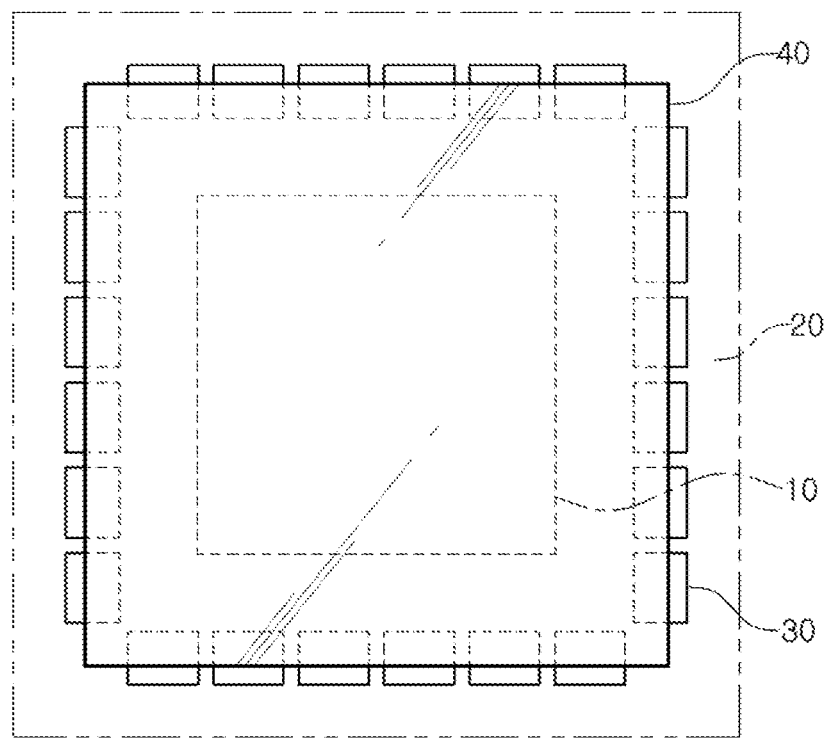
FIG. 2 is a plan view illustrating an example of a sensor package.

FIG. 1 illustrates a cross-sectional view of an example of a sensor package, and FIG. 2 illustrates a plan view of an example of a sensor package according to FIG. 1.

Referring to FIGS. 1 and 2, the example of the sensor package includes a substrate 20 on which an image sensor 10 is mounted, electronic components 30 each having a surface mounted on the substrate 20, and a transparent member 40 coupled to another surface of the corresponding electronic components 30. A transparent member 40 covers the image sensor 10.

A dedicated structure, such as a housing, has conventionally been used to provide the transparent member 40 that covers the image sensor 10 in a sensor package. However, in the illustrated example of the sensor package, by arranging the electronic components 30 in the illustrated manner, a separately dedicated housing structure is not required to provide a transparent member 40 that covers the image sensor 10.

The substrate 20 forms a base on which the image sensor 10 and the electronic components 30, and the like, are mounted.

In this example, the substrate 20 may be a hard substrate 20 that is configured to prevent the occurrence of warping deformation due to external impacts. For example, the substrate 20 may be obtained as a stack of a plurality of soft substrates 20 to prevent warping deformation.

According to one example, the substrate 20 may be formed of an insulating material. The substrate 20 may be, for example, formed of a material such as plastic, synthetic polymer and the like. However, a material of the substrate 20 is not limited thereto. For example, the substrate 20 may be formed of a material such as ceramic.

One or more circuit patterns may be formed on the substrate 20. For example, circuit patterns configured to connect the electronic components 30 may be formed on one surface or both surfaces of the substrate, or inside the substrate 20.

The image sensor 10 mounted on the substrate 20 may be coupled to the substrate 20 via bonding of a wire 10a. That is, the image sensor 10 may be coupled to the substrate 20 via the wire 10a.

That is, the image sensor 10 of the sensor package in the present disclosure may be attached to the substrate 20 via bonding of the wire 10a.

The electronic components 30 may be structures for performing a function of an electronic circuit and may be mounted on the substrate 20.

In this regard, the electronic components 30 may be mounted on the substrate 20 according to a predetermined pattern. For example, the electronic components 30 may be mounted on the substrate 20 to be connected to or separated from the substrate 20 according to a circuit pattern.

The electronic components 30 may be a resistor, condenser, an inductor, or the like. In other words, the electronic components 30 of the sensor package may be one of a resistor, a condenser, and an inductor.

According to one example, a solder ball may be considered a type of electronic components 30 because a solder ball acts to conduct current.

According to another example, the electronic components 30 may be a passive component, such as a resistor or a capacitor. According to another example, the electronic components 30 may be an active component, such as a transistor or an integrated circuit. According to yet another example, the electronic components 30 may be a resistor chip, or a combination of passive components and active components.

In this example, the electronic components 30 are coupled to the transparent member 40 that will be described later. Thus, the transparent member 40 does not need to be provided with a separate dedicated structure to cover the image sensor 10.

In other words, the electronic components 30 serve the act of supporting the transparent member 40 and simultaneously each perform their individual function in the electronic circuit.

In this regard, surfaces of the electronic components 30 used to mount the electronic components 30 on the substrate 20 and surfaces used to couple the transparent member 40 are different surfaces. Referring to FIG. 1, the surfaces of the electronic components 30 used to mount the electronic components 30 are on opposite sides of the electronic components 30 from the surfaces used to mount the transparent member 40.

The surfaces must be different because, if the transparent member 40 and the substrate 20 are provided on the same surface of the electronic components 30, the transparent member 40 and the substrate 20 would not be spaced apart from each other. In other words, only when the transparent member 40 and the substrate 20 are spaced apart from each other, can the image sensor 10 mounted on the substrate 20 be covered with the transparent member 40.

Because the transparent member 40 needs to cover the image sensor 10, the electronic components 30 supporting the transparent member 40 may be mounted on the periphery of the image sensor 10.

In other words, the electronic components 30 of the sensor package according to the present disclosure may be located at the periphery of the image sensor 10, as illustrated in FIG. 1.

As such, the electronic components 30 are provided at the periphery adjacent to the image sensor 10, thereby reducing volume for providing the transparent member 40.

According to one example, two or more electronic components 30 may be provided in order to stably support the transparent member 40 covering the image sensor 10. In this manner, at least two support points are provided with respect to the transparent member 40.

According to one example, the electronic components 30 may be provided on both sides of the image sensor 10.

In other words, the electronic components 30 of the sensor package according to one example may be provided on at least both sides of the image sensor 10.

Referring to FIG. 1, the heights (or thicknesses t2) of the electronic components 30 to which the transparent member 40 are coupled are greater than a height (or a thickness t1) of the image sensor 10; however, the present description is not limited thereto. This will be described in detail with reference to FIGS. 3 and 4 later.

The transparent member 40 may act to protect the image sensor 10. To this end, the transparent member 40 may be provided to cover the image sensor 10.

According to the illustrated example, the transparent member 40 is not supported by the separate dedicated structure; rather, the transparent member 40 is coupled to and supported by the electronic components 30.

In other words, the transparent member 40 may be coupled to other surfaces of the electronic components 30 having some surfaces coupled to the substrate 20, and thus the transparent member 40 may be supported to cover the image sensor 10.

The transparent member 40 may be formed of a transparent insulating material, for example, glass. Thus, light passing through a lens barrel may transmit the transparent member 40 and may finally reach the image sensor 10.

Methods of coupling the transparent member 40 to the electronic components 30 may be diverse such as bonding coupling, bolting coupling, insertion coupling by a mechanical structure, or the like.

Referring to FIG. 1, the sensor package according to the illustrated example further includes an adhesive member 50 that couples the transparent member 40 to the electronic components 30.

The transparent member 40 may be bonding coupled to the electronic components 30 with adhesive force of the adhesive member 50.

The adhesive member 50 may be provided in a liquid or semi-solid state and coated on the electronic components 30 to couple the transparent member 40. Alternatively, the adhesive member 50 may be provided in a solid adhesive film to couple the electronic components 30 to one surface of the adhesive member 50 and couple the transparent member 40 to another surface of the adhesive member 50.

In addition, in a case in which the adhesive member 50 is provided to the electronic components 30, a thickness of the adhesive member 50 may vary according to the heights t2 of the electronic components 30. This will be described in detail with reference to FIG. 5 later.

Figure 3:
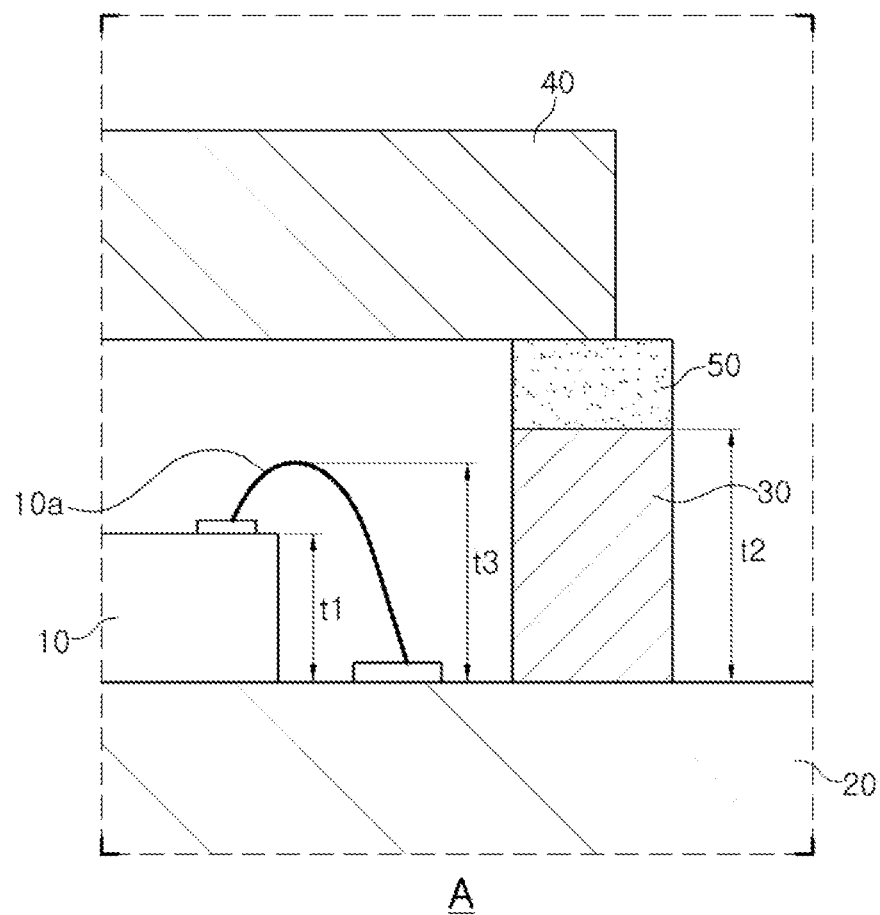
FIGS. 3 and 4 are expanded cross-sectional views of electronic components in additional examples of sensor packages.
Figure 4:
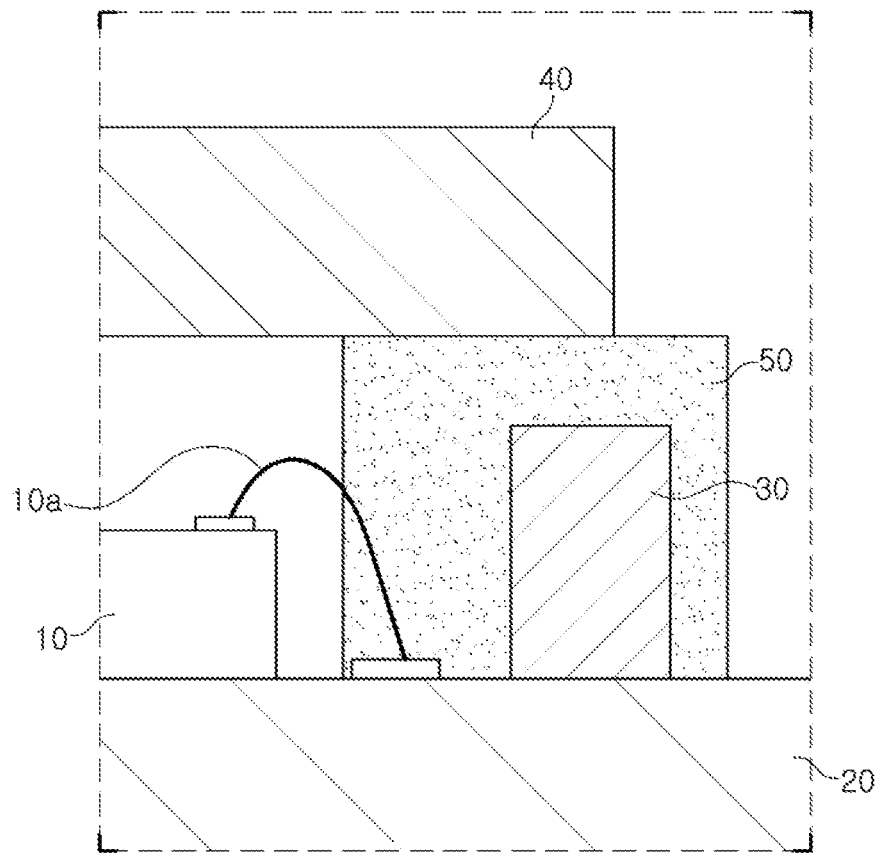

FIGS. 3 and 4 illustrate magnified views of electronic components 30 according to examples of sensor packages. In this regard, FIG. 3 illustrates an example in which the adhesive member 50 is only provided on a top portion of the electronic component 30, and FIG. 4 illustrates an example in which the adhesive member 50 is provided to surround all surfaces excluding a floor portion of the electronic component 30 coupled to the substrate 20.

In other words, the adhesive member 50 may only be provided to the top portion of the electronic component 30 as shown in FIG. 3 for coupling the transparent member 40 to the electronic component 30.

In addition, referring to FIG. 4, the adhesive member 50 is provided to surround the top portion and side portions of the electronic component 30 that excludes the floor portion of the electronic component 30 to act to support the electronic component 30.

Meanwhile, referring to FIGS. 3 and 4, the height t2 of the electronic component 30 of the sensor package is greater than the height t1 of the image sensor 10.

The difference in heights causes the transparent member 40 to be coupled to the electronic component 30 so as to be spaced apart from the image sensor 10 by a predetermined gap. Thus, the image sensor 10 may be prevented from contacting the transparent member 40, thereby improving sensing quality.

Because the image sensor 10 is coupled to the substrate 20 via bonding of the wire 10*a*, in order to avoid interference between the wire 10*a* and the transparent member 40, the height t2 of the electronic component 30 may be set to be greater than a height t3 of an apex of the wire 10*a*.

In other words, the height t2 of the electronic component 30 of the sensor package may be set to be greater than the height t3 of the apex of the wire 10*a*.

However, the height t2 of the electronic component 30 is not limited thereto and may be the same as the height t1 of the image sensor 10, and thus the transparent member 40 may be safely seated in the image sensor 10.

The height t2 of the electronic component 30 may be greater than the height t1 of the image sensor 10 and may be smaller than the height t3 of the apex of the wire 10*a*. In this example, a portion of the wire 10*a* may be bent by the transparent member 40.

Figure 5:
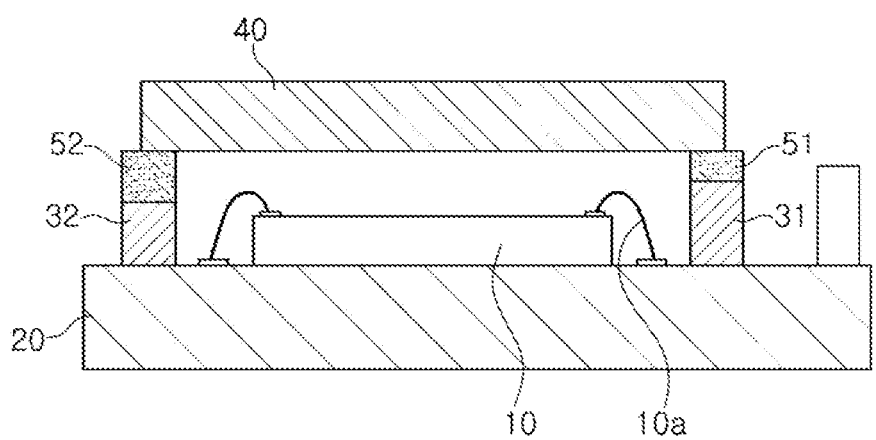
FIG. 5 is a cross-sectional view illustrating yet another example of a sensor package.

FIG. 5 illustrates a cross-sectional view of a sensor package in which heights of the electronic components 30 are different. Referring to FIG. 5, the adhesive member 50 of the sensor package is provided on two electronic components 30 having different heights and couples the transparent member 40 to the electronic components 30 parallel to the substrate 20.

This is because if the transparent member 40 is inclined, light passing through the transparent member 40 may be deflected, and thus sensing quality of the image sensor 10 may deteriorate.

As such, a case in which the transparent member 40 is inclined is a case in which the heights of the electronic components 30 are different.

That is, the transparent member 40 may be coupled to the electronic components 30. In this example, the heights of the electronic components 30 are different. Thus, the transparent member 40 coupled to the electronic components 30 may become inclined if further adjustments are not made.

To prevent this, the example illustrated in FIG. 5, the heights of the electronic components 30 are adjusted via a thickness of the adhesive member 50 such that the transparent member 40 may be provided parallel to the image sensor 10.

In other words, the adhesive member 50 of the sensor package according to the present disclosure includes a first adhesive member 51 provided in a first electronic component 31 located on one side of the image sensor 10 and a second adhesive member 52 provided in a second electronic component 32 having a lesser height than that of the first electronic component 31 and located on another side of the image sensor 10. A thickness of the second adhesive member 52 may be greater than a thickness of the first adhesive member 51 by an amount equal to a height difference between the first electronic component 31 and the second electronic component 32.

Figure 6A:
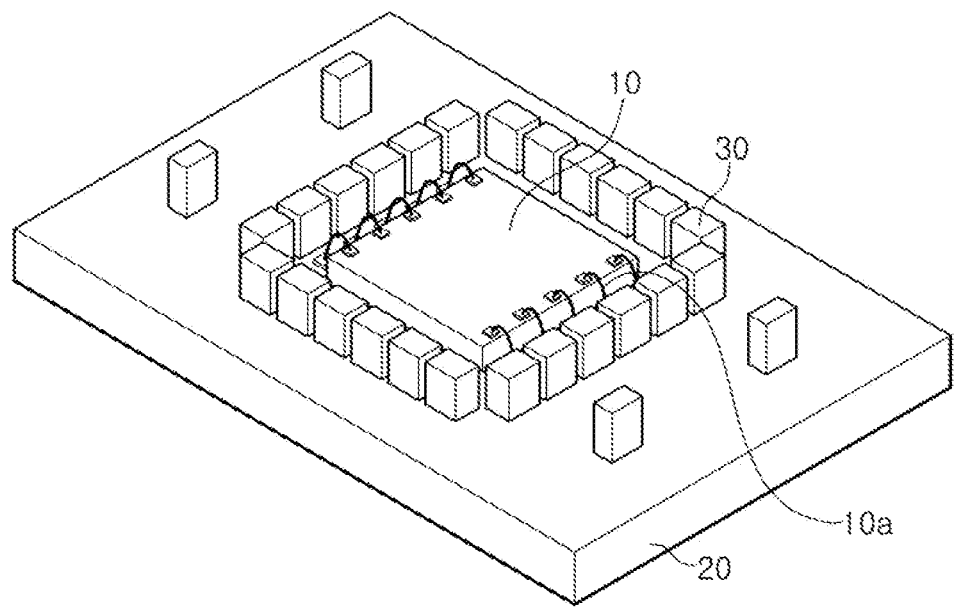
FIGS. 6A through 6C are perspective views illustrating an example of a method of manufacturing a sensor package.
Figure 6B:
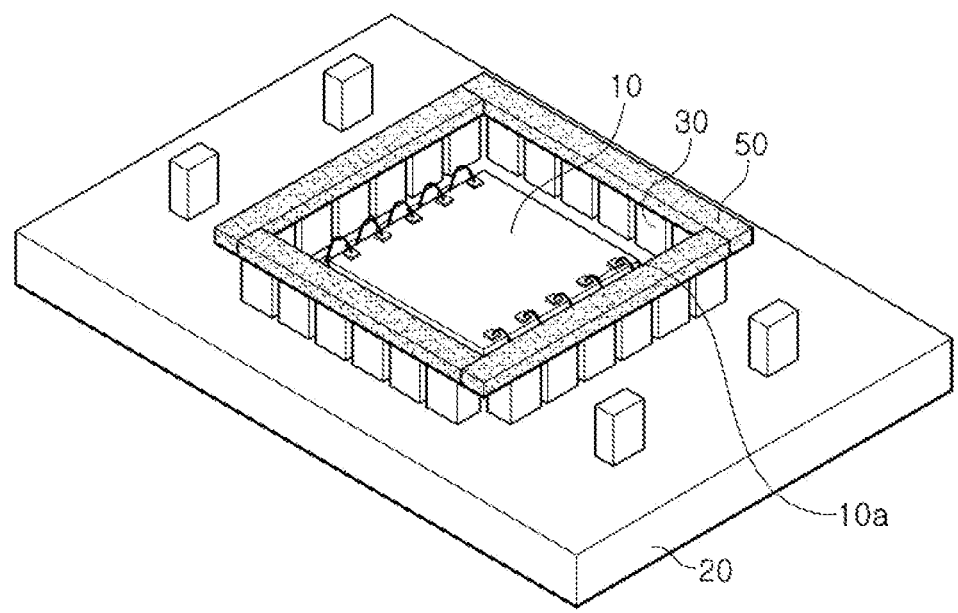
Figure 6C:
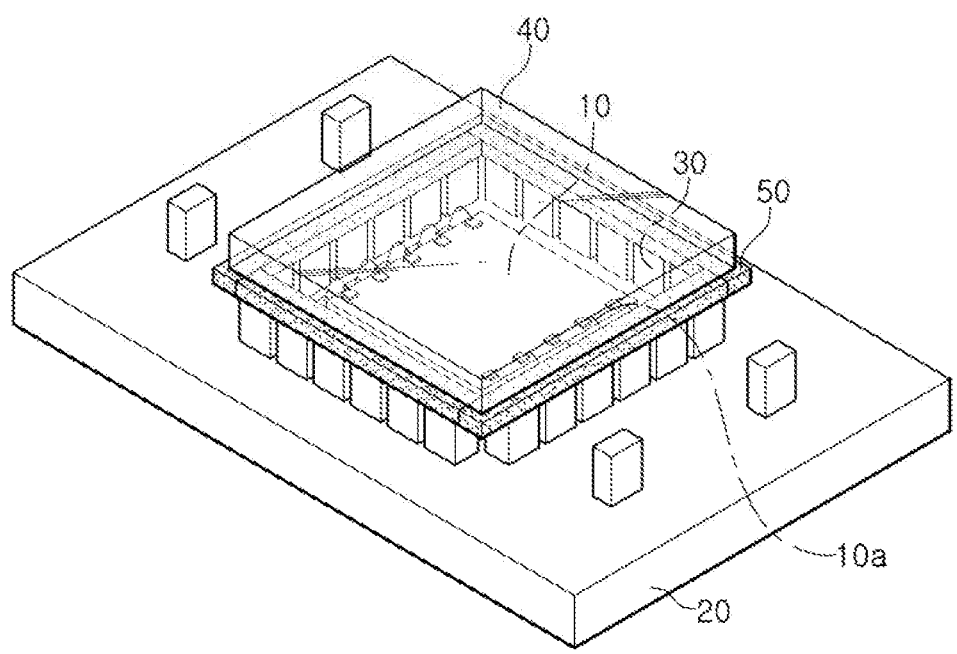

FIGS. 6A through 6C are perspective views illustrating an example of a method of manufacturing a sensor package. In this regard, FIG. 6A illustrates a manufacturing state under which the image sensor 10 and the electronic components 30 are coupled to the substrate 20, and FIG. 6B illustrates a manufacturing state under which the adhesive member 50 is provided to the electronic component 30. FIG. 6C illustrates a manufacturing state under which the transparent member 40 is safely seated in the electronic component.

Referring to FIGS. 6A through 6C, in the example of the method of manufacturing the sensor package, the transparent member 40 is coupled to the electronic components 30 provided in the substrate 20 on which the image sensor 10 is mounted, to cover the image sensor 10.

According to another example, the method of manufacturing the sensor package includes a first operation of providing the substrate 20 on which the image sensor 10 and the electronic components 30 are mounted, a second operation of providing the adhesive member 50 to other surfaces of the electronic components 30 having some surfaces mounted on the substrate 20, and a third operation of safely seating the transparent member 40 on other surfaces of the electronic components 30.

In this regard, the first operation is shown in FIG. 6A, the second operation is shown in FIG. 6B, and the third operation is shown in FIG. 6C, as an example.

A method of providing the adhesive member 50 in the second operation may be an injection method of providing the adhesive member 50 in a liquid or semi-solid state to the electronic components 30 or a method of providing the adhesive member 50 as a solid film.

In other words, the second operation of the method of manufacturing the sensor package illustrated in FIG. 6B involves providing the adhesive member 50 to other surfaces of the electronic components 30 in a liquid or semi-solid state. Applying the adhesive member 50 in a liquid or semi-solid state may provide additional process convenience to an example of a method in which a solid material is provided as the adhesive member 50.

The second operation of the method of manufacturing the sensor package may include providing the adhesive member 50 to other surfaces of the electronic components 30 in the solid film. This case may reduce an occurrence of a defective product due to a leakage of the adhesive member 50.

As described above, the sensor package and the manufacturing method of the same in the present disclosure relate to an disclosure providing the transparent member 40 protecting the image sensor 10.

The sensor package and the manufacturing method of the same according to an embodiment in the present disclosure may not need a separate housing for coupling the transparent member 40, thereby eliminating the necessity to perform a process of manufacturing the housing and a process of coupling the manufactured housing to the substrate 20.

For example, a camera module for rear-view of a vehicle may be obtained by mounting a transparent member 40 over a passive component, such as a resistor, without using a separate plastic housing to mount the transparent member 40 over an image sensor 10.

Therefore, manufacturing cost of an image sensor package may be reduced and a production speed may be increased.

In addition, according to one example, the use of the electronic components 30 in supporting the transparent member 40 makes the sensor package smaller by eliminating the housing structure.

As set forth above, according to another example, a sensor package and a manufacturing method of the same may eliminate the need for providing a separate housing for coupling a transparent member.

Therefore, a process of manufacturing the housing and a process of coupling the housing to a substrate may be eliminated from the method of manufacturing a sensor package.

Accordingly, there are effects of reducing a manufacturing expense of an image sensor package and increasing a production speed.

In addition, the housing may be eliminated, and thus it is possible to make the sensor package smaller.

The examples of sensor package may be widely applied in different technologies, including but not limited to portable terminals such as portable phones, smartphones, tablet PCs, and the like, and in vehicles, such as a rear-view camera of a vehicle, for example, an intelligent servo model (ISM) of cars.

When camera modules are applied, a camera may be provided in a device such as a rear-viewing camera, and the device may be mounted on a vehicle, for example While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A sensor package comprising:
    a substrate on which an image sensor is mounted;
    an electronic component mounted on the substrate; and
    a transparent member supported by the electronic component and covering the image sensor.

2. The sensor package of claim 1, wherein a height of the electronic component is greater than a height of the image sensor.

3. The sensor package of claim 1, wherein the image sensor is attached to the substrate via wire bonding.

4. The sensor package of claim 3, wherein a height of the electronic component is greater than a height of an apex of a wire.

5. The sensor package of claim 1, wherein the electronic component is located at the periphery of the image sensor.

6. The sensor package of claim 1, wherein the electronic components are provided on both sides of the image sensor.

7. The sensor package of claim 6, further comprising an adhesive member coupling the transparent member to the electronic component.

8. The sensor package of claim 7, wherein the electronic component comprises a plurality of electronic components having different heights, and the adhesive member is provided in the plurality of electronic components and couples the transparent member to the plurality of electronic components parallel to the substrate.

9. The sensor package of claim 8, wherein the adhesive member comprises:
    a first adhesive member provided in a first electronic component, among the plurality of electronic components, located on one side of the image sensor; and
    a second adhesive member provided in a second electronic component, among the plurality of electronic components, having a lesser height than that of the first electronic component and located on another side of the image sensor,
    wherein a thickness of the second adhesive member is greater than a thickness of the first adhesive member by an amount equal to a height difference between the first electronic component and the second electronic component.

10. The sensor package of claim 1, wherein the electronic component is one of a resistor, a condenser, and an inductor.

11. A method of manufacturing a sensor package, the method comprising coupling a transparent member to an electronic component provided on a substrate such that the transparent member covers an image sensor provided on the substrate and the electronic component supports the transparent member.

12. The method of claim 11, wherein the coupling of the transparent member comprises:
    obtaining the substrate on which the image sensor and the electronic component are mounted;
    applying an adhesive member to a surface of the electronic component opposite from the substrate; and
    positioning the transparent member on the adhesive member applied on the electronic component.

13. The method of claim 12, wherein the applying of the adhesive member comprises applying the adhesive member to the electronic component in a liquid or semi-solid state.

14. The method of claim 12, wherein the applying of the adhesive member comprises applying the adhesive member to the electronic component as a solid film.

15. The sensor package manufacturing method of claim 12, wherein the coupling of the transparent member to the electronic component comprises coupling the transparent member to a plurality of electronic components provided around the substrate such that the plurality of electronic components support the transparent member above the image sensor.

16. A sensor package comprising:
    an image sensor and an electronic component disposed on a substrate; and
    a transparent member supported by the electronic component and covering the image sensor.

17. The sensor package of claim 16, further comprising an adhesive member disposed between the transparent member and the image sensor.

18. The sensor package of claim 16, wherein the electronic component comprises a plurality of electronic components disposed on the substrate at two opposing sides of the image sensor such that the plurality of electronic components support the transparent member above the image sensor.

19. The sensor package of claim 16, wherein the sensor package is configured as a camera module for a vehicle.

* * * * *